(12) United States Patent
Miyatani et al.

(10) Patent No.: US 7,696,761 B2
(45) Date of Patent: Apr. 13, 2010

(54) SPECTRUM ANALYZING METHOD, DISTORTION DETECTOR AND DISTORTION COMPENSATION AMPLIFYING DEVICE

(75) Inventors: Tetsuhiko Miyatani, Tokyo (JP); Masashi Naito, Tokyo (JP); Naoki Hongo, Tokyo (JP); Takashi Okazaki, Tokyo (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 53 days.

(21) Appl. No.: 11/795,989

(22) PCT Filed: Aug. 10, 2006

(86) PCT No.: PCT/JP2005/021254

§ 371 (c)(1),
(2), (4) Date: Jul. 25, 2007

(87) PCT Pub. No.: WO2006/082681

PCT Pub. Date: Aug. 10, 2006

(65) Prior Publication Data

US 2008/0068080 A1    Mar. 20, 2008

(30) Foreign Application Priority Data

Feb. 1, 2005    (JP)    ............................. 2005-024847

(51) Int. Cl.
*G01R 23/20* (2006.01)
*G01R 23/16* (2006.01)

(52) U.S. Cl. .................... 324/620; 324/626; 324/76.21
(58) Field of Classification Search ................. 324/620, 324/158.1, 626, 76.21
See application file for complete search history.

(56) References Cited

U.S. PATENT DOCUMENTS 5,748,001 A * 5/1998 Cabot .......................... 324/624
6,353,642 B1 * 3/2002 Asahara et al. .............. 375/344

FOREIGN PATENT DOCUMENTS

| JP | 9-138251 | 5/1997 |
| JP | 2004-121625 | 4/2004 |
| JP | 2004-128921 | 4/2004 |

* cited by examiner

*Primary Examiner*—Amy He
(74) *Attorney, Agent, or Firm*—McGinn IP Law Group, PLLC

(57) ABSTRACT

The invention provides a spectrum analyzing method, a distortion detector and a distortion compensation amplifying device for performing time/frequency conversion processing at high speed, and reducing a convergent time of a compensation coefficient. The distortion detector for detecting distortion in a frequency area with respect to an input signal includes a time window processing section for multiplying the input signal by a time window; an averaging processing section for averaging an output of the time window processing section; an FFT processing section for converting an output of the averaging processing section from a time area to a frequency area; and a distortion extracting section for extracting a distortion component from an output of the FFT processing section.

3 Claims, 6 Drawing Sheets

FIG.3

$$A_4 = \sum_{t=0}^{4095}\{s(t)\cos(2\pi t \cdot 4/4096)\} + j\sum_{t=0}^{4095}\{s(t)\sin(2\pi t \cdot 4/4096)\}\cdots\text{(FORMULA 1)}$$

FIG.4

$$\begin{aligned}A_{4c} &= s(t_0)\cos(2\pi t_0 \cdot 4/4096) + s(t_1)\cos(2\pi t_1 \cdot 4/4096) \\ &\quad \cdots + s(t_{1023})\cos(2\pi t_{1023} \cdot 4/4096) \\ &\quad + s(t_{1024})\cos(2\pi t_{1024} \cdot 4/4096) + s(t_{1025})\cos(2\pi t_{1025} \cdot 4/4096) \\ &\quad \cdots + s(t_{2047})\cos(2\pi t_{2047} \cdot 4/4096) \\ &\quad + s(t_{2048})\cos(2\pi t_{2048} \cdot 4/4096) + s(t_{2049})\cos(2\pi t_{2049} \cdot 4/4096) \\ &\quad \cdots + s(t_{3071})\cos(2\pi t_{3071} \cdot 4/4096) \\ &\quad + s(t_{3072})\cos(2\pi t_{3072} \cdot 4/4096) + s(t_{3073})\cos(2\pi t_{3073} \cdot 4/4096) \\ &\quad \cdots + s(t_{4095})\cos(2\pi t_{4095} \cdot 4/4096) \\ &\quad \cdots\text{(FORMULA 2)}\end{aligned}$$

FIG.5

$$\begin{aligned}A_{4c} &= \{s(t_0) + s(t_{1024}) + s(t_{2048}) + s(t_{3072})\}\cos(2\pi t_0 \cdot 4/4096) \\ &\quad + \{s(t_1) + s(t_{1025}) + s(t_{2049}) + s(t_{3073})\}\cos(2\pi t_1 \cdot 4/4096) \\ &\quad \vdots \\ &\quad + \{s(t_{1023}) + s(t_{2047}) + s(t_{3071}) + s(t_{4095})\}\cos(2\pi t_{1023} \cdot 4/4096) \\ &\quad \cdots\text{(FORMULA 3)}\end{aligned}$$

FIG.6

$$w(t) = 0.5 \cdot \{0.762 - \cos(2\pi t/M) + 0.238 \cdot \cos(4\pi t/M)\}\cdots\text{(FORMULA 4)}$$

FIG.12
(Conventional)
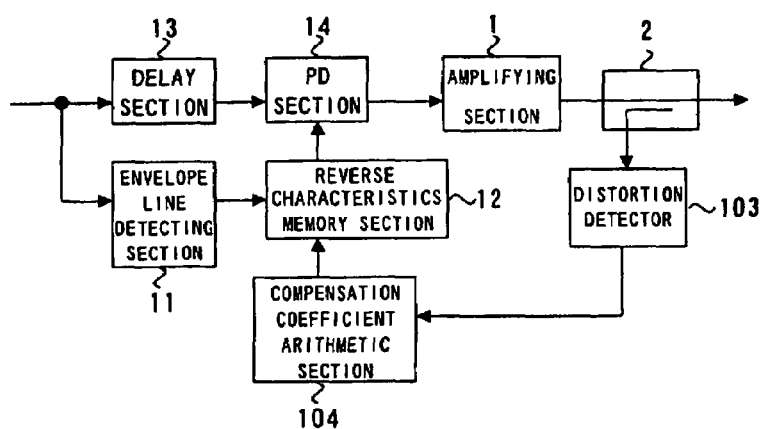

US 7,696,761 B2

SPECTRUM ANALYZING METHOD, DISTORTION DETECTOR AND DISTORTION COMPENSATION AMPLIFYING DEVICE

TECHNICAL FIELD

The present invention relates to a spectrum analyzing method, a distortion detector and a distortion compensation amplifying device for detecting and compensating distortion at an amplifying time.

BACKGROUND ART

An amplifier is required in wireless communication to amplify a transmission signal. The amplifier generates nonlinear distortion as a nonlinear output level and an output phase with respect to an input level. Input vs. output characteristics showing nonlinear distortion have AM-AM characteristics showing the output level with respect to the input level, and AM-PM characteristics showing the output phase with respect to the input level. However, the amplifier is daringly used in an area for generating the nonlinear distortion to improve electric power efficiency. The nonlinear distortion generally causes unnecessary electric power emission over a band three to five times (seven times in a bad case) as much as a band width of the transmission signal. FIG. 11 is a spectrum showing one example of the transmission signal including distortion. The axis of abscissa shows a relative frequency with respect to a carrier frequency, and the axis of ordinate shows a relative level with respect to a desirable wave. In addition to the desirable wave, −IM7 (a seventh order higher harmonic wave of a negative side), −IM5 (a fifth order higher harmonic wave of the negative side), −IM3 (a fifth order higher harmonic wave band of the negative side), +IM3 (a third order higher harmonic wave of a positive side), +IM5 (a fifth order higher harmonic wave of the positive side) and +IM7 (a seventh order higher harmonic wave of the positive side) are shown.

Accordingly, a distortion compensation amplifying device for compensating the nonlinear distortion is required. As a system of signal processing for compensating the nonlinear distortion, there are an FF (Feed Forward) system and an APD (Adaptive Pre-Distortion) system. Each system is embodied at a commercial use level and a trial manufacturing level, and is effective. In the FF system, only distortion of an amplifier output is extracted and is subtracted from the amplifier output. In the APD system, distortion characteristics are given in advance before an amplifier input, and are cancelled with respect to the amplifier. In the APD system, all can be realized in digital signal processing. Therefore, the APD system is promising in compact formation and low cost formation. Further, in the APD system, an adaptive algorithm for following a change in characteristics of the amplifier such as temperature characteristics and a change with the passage of time, etc. is used.

FIG. 12 is a block diagram showing one example of the construction of a conventional distortion compensation amplifying device. This distortion compensation amplifying device has an amplifying section 1, a distributing section 2, a distortion detector 103, a compensation coefficient arithmetic section 104, an envelope line detecting section 11, a reverse characteristics memory section 12, a delay section 13 and a PD (pre-distorting) section 14.

There are several kinds of adaptive algorithms. For example, there is a method for changing a distortion compensation coefficient while a distortion signal is monitored (e.g., see patent literature 1). The reverse characteristics memory section 12 stores the AM-AM characteristics and reverse characteristics of the AM-PM characteristics provided in the amplifying section 1 in advance. The envelope line detecting section 11 outputs an envelope of the transmission signal as an address of the reverse characteristics memory section 12. The reverse characteristics memory section 12 outputs the reverse characteristics stored to this address to the PD section 14. The PD section 14 gives the reverse characteristics to the transmission signal delayed in the delay section 13. The amplifying section 1 amplifies an output of the PD section 14. The distributing section 2 distributes an output of the amplifying section 2, and outputs one of this output to the exterior and outputs another of this output to the distortion detector 103. The compensation coefficient arithmetic section 104 updates contents of the reverse characteristics memory section 12 by using an adaptive algorithm so as to minimize distortion detected by the distortion detector 103.

For example, patent literature 2 shown below is known as a relative prior art of the present invention. This pulse wave detector can measure an accurate pulse number even when an arithmetic means low in calculation ability is used.

Patent literature 1: JP-A-2004-128921
Patent literature 2: JP-A-2004-121625 (pp. 4-7 and FIG. 1)
Patent literature 3: JP-A-9-138251

DISCLOSURE OF THE INVENTION

Problems that the Invention is to Solve

However, in the above distortion compensation device, a problem exists in that cost of hardware is taken or a convergent time of the adaptive algorithm becomes too late.

As an example of a method for taking cost of hardware, there is a method for simultaneously monitoring plural distortion bands. In frequency characteristics as shown in FIG. 11, it is necessary to monitor distortion bands of at least four places of −IM5, −IM3, +IM3, +IM5. Further, four analog signal receiving systems are required to monitor the distortion bands of the four places in an analog signal in this way. Further, it is necessary to remove level deviation between the four analog signal receiving systems. Therefore, it becomes difficult in a cost aspect.

On the other hand, as an example of a method for restraining cost of hardware, there is a method of distortion detection in a frequency area using FFT (Fast Fourier Transform). In this method, the number of signal receiving systems may be set to one system. A spectrum is obtained by converting the amplifier output into a digital signal by a high speed A/D converter, and performing time/frequency conversion by FFT.

However, a band of about 20 MHz is required in a transmission signal of recent years. For example, this is a case in which four carriers are supposed in a band of 5 MHz per one carrier in W-CDMA (Wideband-Code Division Multiple Access). The transmission signal in FIG. 11 has two carriers of W-CDMA. However, as imagined from this figure, when nonlinear distortion is generated in the four carriers, a band width of 100 MHz is required. If no sampling operation of 200 MHz or more is performed by a sampling theorem, no accurate distortion detection can be performed.

When FFT is intended to be realized by hardware in such a condition, a circuit scale is enormous so that it becomes difficult in the cost aspect. Further, when FFT is intended to be realized by software, time is taken in processing. For example, about 4 msec is required when FFT of 1024 points (samples) is executed by using DSP (Digital Signal Processor) operated at 300 MHz. Further, in this case, distortion can be detected by using FFT for only a short time of 1024 samples among a time area signal of about 4 msec. An average of a long time is required to obtain an average spectrum. Further, this distortion compensation amplifying device makes the long time average to judge whether an updating result is correct or not every time a compensation coefficient is updated at one time. Therefore, there is a case in which a convergent time of about 20 minutes is required. In general, it is required that the convergent time is set to about 10 seconds. Accordingly, it is necessary to perform high speed operation 120 times or more faster. Thus, when FFT is realized by software, no time/frequency conversion processing can be performed with respect to a signal inputted in real time during the time/frequency conversion processing. Therefore, the convergent time of the compensation coefficient is increased.

The present invention is made to solve the above problem point, and its object is to provide a spectrum analyzing method, a distortion detector and a distortion compensation amplifying device for performing the time/frequency conversion processing at high speed, and reducing the convergent time.

Means for Solving the Problems

To solve the above problem, the present invention resides in a spectrum analyzing method for calculating a time average of a spectrum and comprising:

a first step for multiplying an input signal by a window function of a cycle of an integer times an FFT point number;

a second step for averaging an output signal of the first step at an FFT point number interval, and outputting a signal of the FFT point number; and a third step for performing FFT with respect to an output signal of the second step.

Further, the present invention resides in a distortion detector for detecting distortion in a frequency area with respect to an input signal and comprising:

an averaging processing section for averaging the input signal;

a time/frequency conversion processing section for converting an output of the averaging processing section from a time area to a frequency area; and a distortion extracting section for extracting a distortion component from an output of the time/frequency conversion processing section;

Further, in the distortion detector in the present invention, it is characterized in that a time window processing section for multiplying the time area signal by a time window, and outputting this multiplied time area signal to the averaging processing section is further arranged.

Further, the present invention resides in a distortion detector for detecting distortion in a frequency area with respect to an input signal and comprising:

a time window processing section for multiplying the input signal by a time window;

an averaging processing section for averaging an output of the time window processing section;

a time/frequency conversion processing section for converting an output of the averaging processing section from a time area to a frequency area; and a distortion extracting section for extracting plural distortion components from an output of the time/frequency conversion processing section. It is characterized in that the averaging processing section makes an average every unit for conversion by the time/frequency conversion processing section, and the width of the time window is an integer times the unit.

Further, in the distortion detector in the present invention, it is characterized in that FFT is used in the time/frequency conversion processing section.

Further, in the distortion detector in the present invention, it is characterized in that the averaging processing section makes an adding calculation of the time area signal every length of the FFT.

Further, the present invention resides in a distortion compensation amplifying device for amplifying a signal inputted from the exterior and compensating distortion, and comprising:

an amplifying section for amplifying a first signal;

a distributing section for distributing an output of the amplifying section;

an averaging processing section for averaging one output of the distributing section;

a time/frequency conversion processing section for converting an output of the averaging processing section from a time area to a frequency area;

a distortion extracting section for extracting a distortion component from an output of the time/frequency conversion processing section; and a distortion compensating section for giving pre-distortion based on an output of the distortion extracting section to the signal inputted from the exterior, and setting this given signal to the first signal.

Effect of the Invention

In accordance with the present invention, after averaging processing using hardware is performed, time/frequency conversion processing using software is performed so that a convergent time can be greatly reduced. Accordingly, distortion can be detected at low cost even in a wide band signal.

BRIEF DESCRIPTION OF THE DRAWINGS

FIG. 3 is a formula showing one example of formula 1 expressing time/frequency conversion in accordance with the present invention.

FIG. 4 is a formula showing one example of formula 2 expressing the time/frequency conversion in accordance with the present invention.

FIG. 5 is a formula showing one example of formula 3 expressing the time/frequency conversion in accordance with the present invention.

FIG. 6 is a formula showing one example of formula 4 expressing a Rosenfield window in accordance with the present invention.

FIG. 12 is a block diagram showing one example of the construction of a conventional distortion compensation amplifying device.

Figure 1:
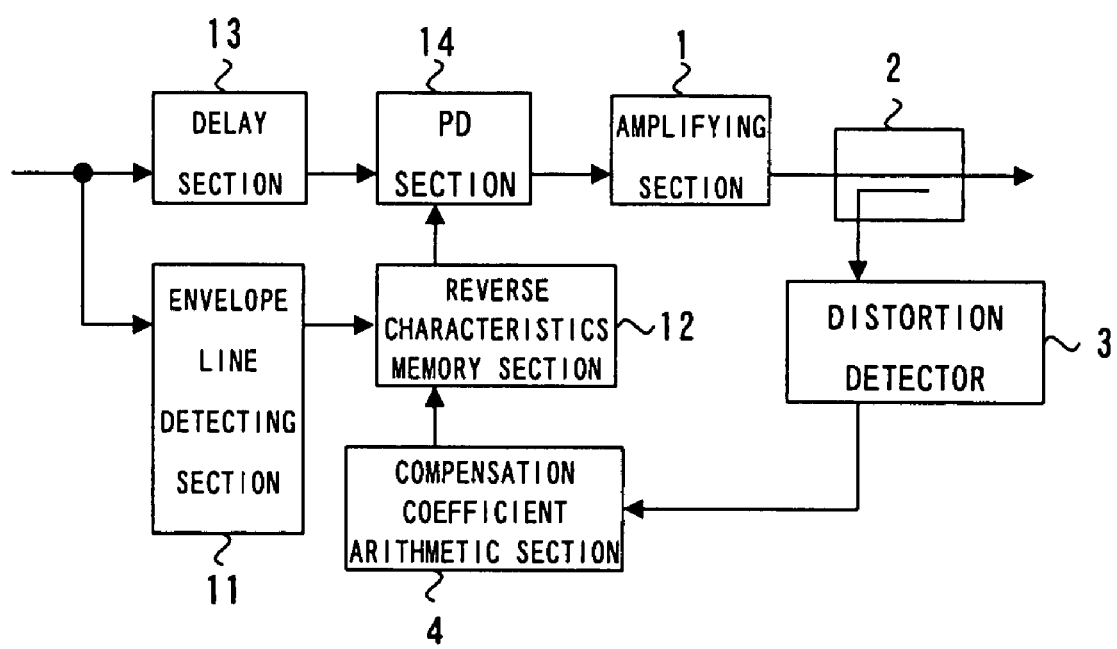
FIG. 1 is a block diagram showing one example of the construction of a distortion compensation amplifying device in accordance with the present invention.

DESCRIPTION OF THE REFERENCE NUMERALS AND SIGNS 1 amplifying section
2 distributing section
3 distortion detector
4 compensation coefficient arithmetic section
11 envelope line detecting section
12 reverse characteristics memory section
13 delay section
14 PD section
21 frequency converting section
22 BPF
23 A/D
31 address generating section
32 time window generating section
33 multiplying section
34 adding section
41 counter
42 switching section
51 dual port memory
52 FFT processing section
53 distortion extracting section

BEST FOR CARRYING OUT THE INVENTION

Embodiment modes of the present invention will next be explained with reference to the drawings.

First, the construction of a distortion compensation amplifying device in accordance with the present invention will be explained. FIG. 1 is a block diagram showing one example of the construction of the distortion compensation amplifying device in accordance with the present invention. In FIG. 1, the same reference numerals as FIG. 12 designate the same or corresponding objects as objects shown in FIG. 12, and their explanations are omitted here. Further, in comparison with the distortion compensation amplifying device of FIG. 12, the distortion compensation amplifying device of FIG. 1 has a distortion detector 3 instead of the distortion detector 103.

Figure 2:
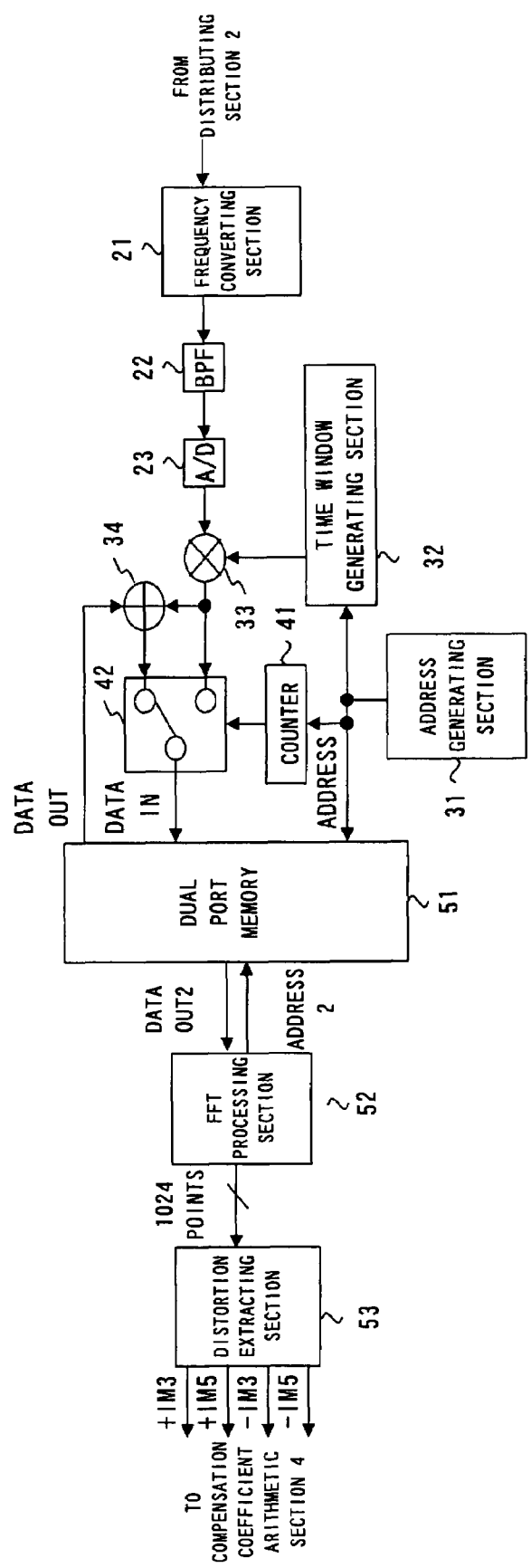
FIG. 2 is a block diagram showing one example of the construction of a distortion detector in accordance with the present invention.

Next, the construction of the distortion detector 3 in accordance with the present invention will next be explained. FIG. 2 is a block diagram showing one example of the construction of the distortion detector in accordance with the present invention. This distortion detector has a frequency converting section 21, BPF (Band-Pass Filter) 22, an A/D converting section (A/D) 23, an address generating section 31, a time window generating section 32, a multiplying section 33, an adding section 34, a counter 41, a switching section 42, a dual port memory 51, an FFT processing section 52 and a distortion extracting section 53. In this embodiment mode, an example in which the distortion detector 3 detects distortion at one time from a time area signal of 4096 points which is time four times that of 1024 points by using 1024 points FFT will be explained.

An output of the distributing section 2 is down-converted in the frequency converting section 21, and a band is limited in BPF 22, and this output is then converted from an analog time area signal to a digital time area signal in the A/D converting section 23. After the A/D conversion, required processing such as digital orthogonal wave detection, filtering, etc. is suitably executed. The address generating section 31 outputs an address corresponding to an integer times (e.g., four times) a point number (a unit for performing time/frequency conversion) of FFT. The time window generating section 32 outputs a time window in accordance with the address from the address generating section 31. The multiplying section 33 performs time window processing with respect to the time area signal by multiplying an output of the A/D converting section 23 and an output of the time window generating section 32.

The adding section 34 adds an output of the multiplying section 33 and the output of DATA OUT of the dual port memory 51. The counter 41 counts an averaging time number every FFT point number, and connects the switching section 42 to a lower side at one time with respect to the averaging time number. In this embodiment mode, the FFT point number is set to 1024, and the averaging time number is set to 4. The switching section 42 inputs an output of the multiplying section 33 or the adding section 34 to DATA IN of the dual port memory 51 in accordance with the counter 41. The dual port memory 51 reads-out the time area signal in accordance with the address from the address generating section 31, and outputs the time area signal from DATA OUT. Further, the dual port memory 51 writes the time area signal inputted to DATA IN in accordance with an address inputted from the address generating section 31 to ADDRESS. As a result, an averaging time area signal averaged and processed by adding four time area signals of 1024 points is stored to the dual port memory 51. Thus, time window processing and averaging processing are realized by hardware.

Further, the dual port memory 51 reads-out the averaging time area signal in accordance with an address inputted from the FFT processing section 52 to ADDRESS2, and outputs the averaging time area signal from DATA OUT2. The FFT processing section 52 performs time/frequency conversion processing of the averaging time area signal, and outputs an obtained frequency area signal to the distortion extracting section 53. The time/frequency conversion processing using the FFT processing section 52 is complex FFT, and is realized by a butterfly arithmetic calculation using DSP. The distortion extracting section 53 outputs a relative level to a carrier with respect to −IM5, −IM3, +IM3, +IM5 from the frequency area signal to the compensation coefficient arithmetic section 4.

The compensation coefficient arithmetic section 4 updates contents of the reverse characteristics memory section 12 by using an adaptive algorithm so as to minimize distortion detected by the distortion detector 3. For example, a concrete construction may be the same as patent literature 1. Further, when the PD section 14 has a control amount for compensating a memory effect, this control amount may be also updated on the basis of an unbalance of −IM3 and +IM3, etc.

Next, averaging processing, time/frequency conversion processing and time window processing will be explained as an operation principle of the distortion detector 3 in accordance with the present invention.

First, the averaging processing from 4096 points to 1024 points in the adding section 34, and the time/frequency conversion processing of 1024 points in the FFT processing section 52 will be explained. The FFT processing section 52 calculates a frequency area signal by multiplying and integrating a twiddle factor according to frequency for equalization. Here, an example of a frequency area signal A4 of 4 Hz in normalization frequency is shown. The frequency area signal A4 is represented by formula 1 of FIG. 3. Here, s(t) is a time area signal, and t is time and j is an imaginary unit. The twiddle factor in formula 1 is a sine wave and a cosine wave with 4096 points as four cycles, and one cycle is formed by 1024 points.

Formula 2 of FIG. 4 shows a formula in which A4 is expanded and only A4c as a first term of A4 is expressed for brevity. A cycle of the twiddle factor is 1024 points, and the twiddle factor multiplied with respect to the time area signal separated by 1024 points becomes equal. Accordingly, a formula collecting terms of the equal twiddle factor in formula 2 is shown in formula 3 of FIG. 5. Formula 3 shows that the same result as formula 1 is also obtained even when the time area signal separated by the cycle of the twiddle factor is added and the twiddle factor is then multiplied and integrated. Accordingly, the result of 1024 points FFT of this embodiment is equal to a result obtained by taking out the result of normal 4096 points FFT every 4 points.

In reality, the averaging processing of the time area signal is first performed by hardware such as the adding section 34, the dual port memory 51, etc. Next, the time/frequency conversion processing of the averaging time area signal is performed by software of the FFT processing section 52. Thus, time taken in the time/frequency conversion processing is reduced, and an update cycle of the adaptive algorithm can be shortened. Further, an unexpected defeat through carelessness with respect to a real time signal is reduced, and the averaging processing can be performed with respect to a longer time signal. Accordingly, more average distortion in which an influence of a change of electric power of a transmission signal is reduced can be fed back to the compensation coefficient arithmetic section 4, and the adaptive algorithm can be converged at high speed. In accordance with this embodiment mode, a convergent time taking about 10 minutes in FFT using conventional software can be reduced to about 10 seconds by this multiplication effect. Further, in this embodiment mode, processing is performed every time area signal of 4096 points, but frequency resolution corresponds to FFT of 1024 points. However, an orthogonal degree between respective frequencies is improved.

In the averaging processing in this embodiment mode, an adding calculation is made by the averaging time number and reset is performed. However, a moving average and a weighting average using a forgetting coefficient may be also made.

Figure 7:
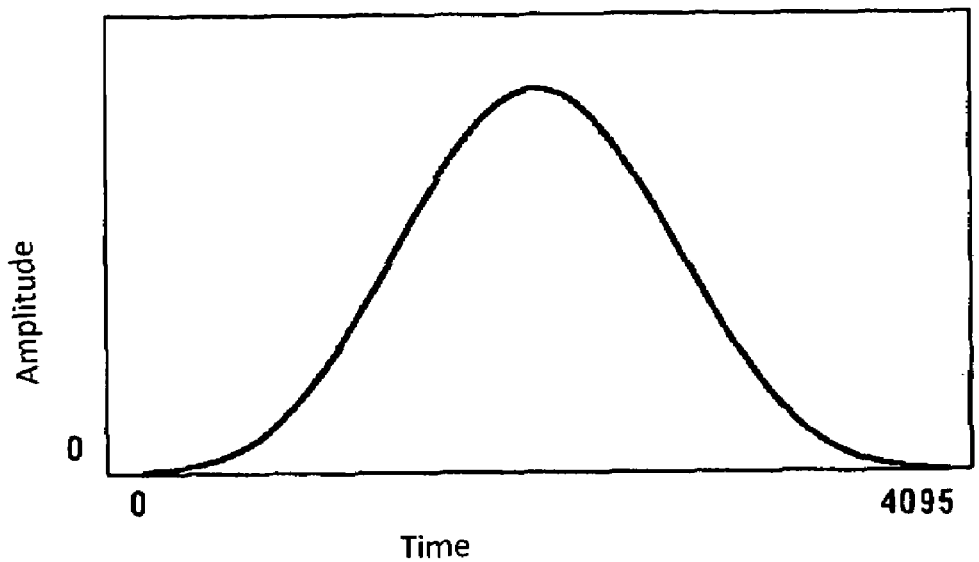
FIG. 7 is a waveform showing one example of a first time window in accordance with the present invention.

Next, time window processing will be explained. FFT is conversion with a cycle signal as a premise. Accordingly, when the real time signal is processed, it is normal to use a window function for attenuating the beginning and the end of a signal of an FFT length (FFT point number) amount to 0 in processing the real time signal. Here, an example of the time window is given. A first time window is a window function of an averaging length. The averaging length is FFT length× averaging time number. A Rosenfield window w(t) as the window function is expressed by formula 4 of FIG. 6. Here, M is a window function length. FIG. 7 is a waveform showing one example of the first time window in accordance with the present invention. Time is shown by a point number on the axis of abscissa, and the axis of ordinate shows amplitude. In this embodiment mode, the Rosenfield window used in the first time window is set to M=4096.

Figure 8:
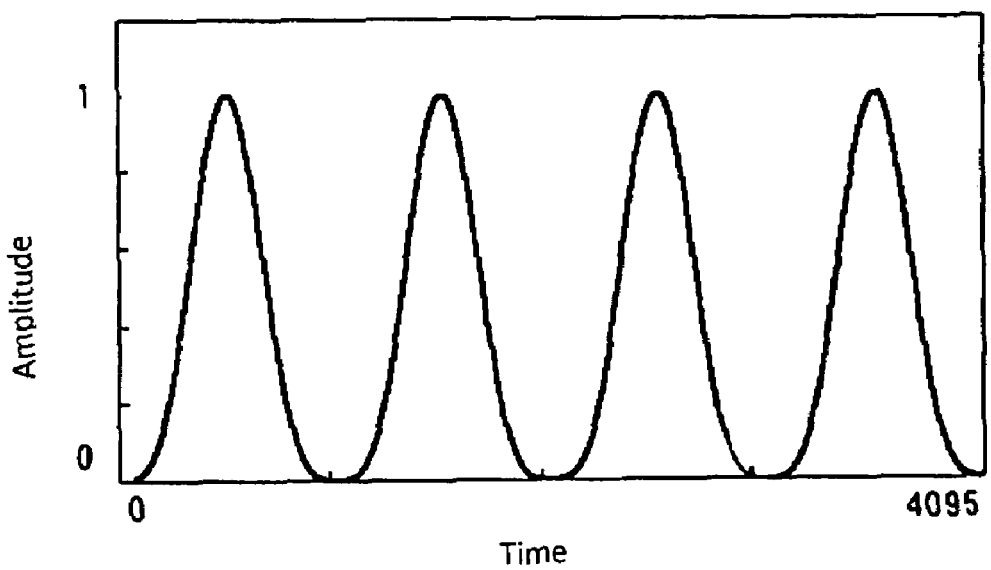
FIG. 8 is a waveform showing one example of a second time window in accordance with the present invention.

A second time window is a time window in which the window function of the FFT length is repeated by the averaging time number. FIG. 8 is a waveform showing one example of the second time window in accordance with the present invention. In this embodiment mode, the Rosenfield window used in the second time window is set to M=1024.

Figure 9:
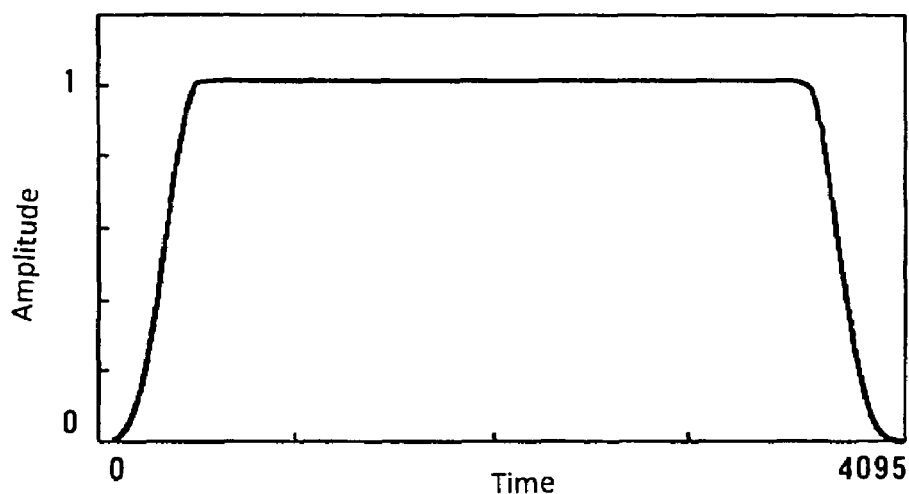
FIG. 9 is a waveform showing one example of a third time window in accordance with the present invention.

A third time window is a time window in which the first half of the window function of the FFT length is used in rising, and the latter half of the window function of the FFT length is used in falling, and an intermediate portion is held at maximum value 1. FIG. 9 is a waveform showing one example of the third time window in accordance with the present invention. In this embodiment mode, the Rosenfield window used in one portion of the third time window is set to M=1024.

Figure 10:
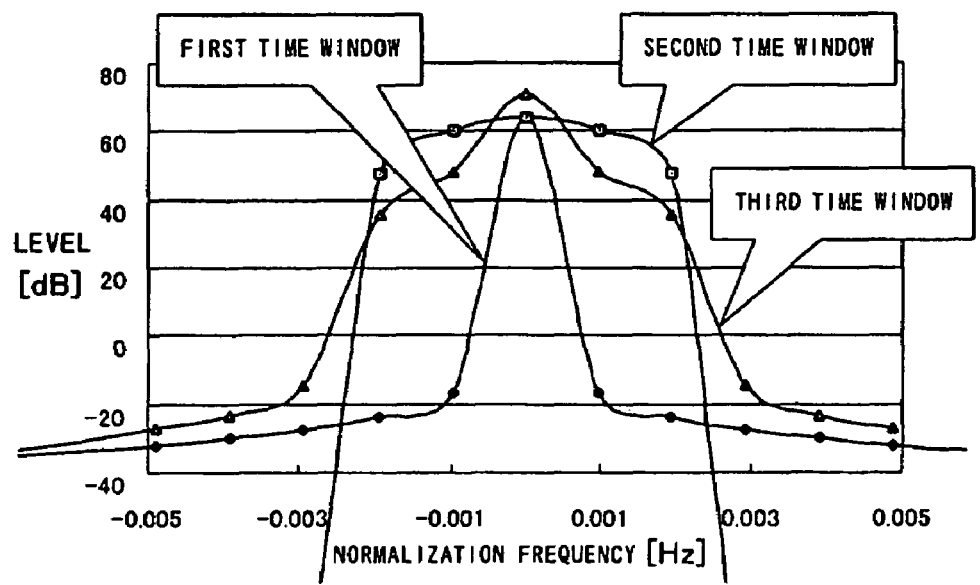
FIG. 10 is a spectrum showing one example of frequency characteristics of the time window in accordance with the present invention.

Since frequency characteristics of the above three kinds of time windows are different, the frequency characteristics are selected in accordance with a spectrum of a signal. FIG. 10 is a spectrum showing one example of the frequency characteristics of the time window in accordance with the present invention. Further, the time window generating section 32 can be realized by a memory for storing the waveform of the window function. Since the window function is symmetrical on the left and right sides, memory capacity can be also set to a half of the window function length. In particular, the second time window and the third time window may be set to memory capacity of an amount of 512 points. In this embodiment mode, the Rosenfield window is used as the window function, but another window function such as a Blackman window, etc. may be also used.

Figure 11:
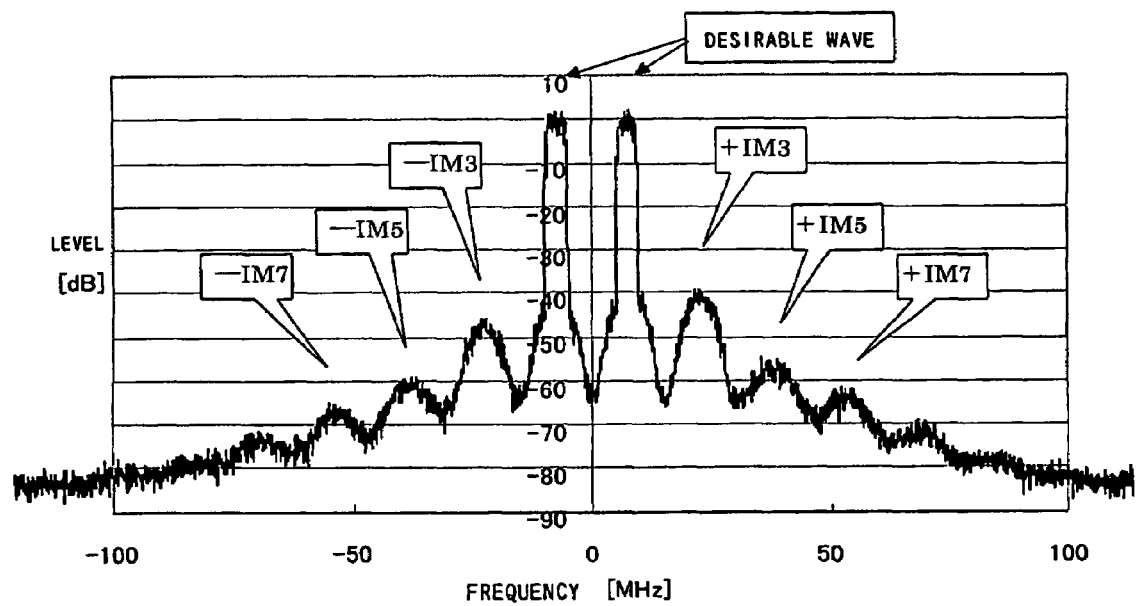
FIG. 11 is a spectrum showing one example of a transmission signal including distortion.

The window function is not necessarily good as a band is wide and flat. If the spectrum of W-CDMA is averaged for a certain time, this spectrum is provided as shown in FIG. 11. However, an instant spectrum is close to a tone of a carrier number. There is a possibility that a detection level is not uniformed and a specific carrier and distortion cannot be detected in accordance with the relation of a detuning interval of the carrier tone and frequency resolution of FFT. Accordingly, a resolution of about 30 kHz is recommended in a spectrum measurement of W-CDMA. On the other hand, even when a sample rate is set to 123 MHz to acquire one portion of IM3 and IM5 of FIG. 11, frequency resolution becomes 120 kHz in 1024 points FFT. However, the modulated actual carrier has a band in no small numbers, and is multiplied by the window function having a frequency component, and the spectrum is moderately diffused. Thus, detection can be also performed in sensitivity having no problem with respect to a frequency component unable to be decomposed. Accordingly, FFT less than 4096 points can be used.

An optimum window function depends on a system construction. However, there is a case in which it is effective to switch and use plural window functions or use a window function provided by synthesizing plural window functions, etc. For example, window width normalization frequencies 1 Hz, 2 Hz, - - - (real frequencies 30 kHz, 60 kHz - - - ), etc. are also respectively multiplied, connected or synthesized with respect to an original window function (4096 points). Further, a frequency area signal obtained in FFT has sensitivity in a sinc function shape in the range of a Nyquist frequency with a pertinent frequency as a center. Accordingly, when plural window functions of different frequency characteristics (particularly, of a phase) are used, it is possible to cancel sensitivity with respect to a frequency except for a predetermined desirable decomposed frequency. This can be also easily achieved by superposing random noises on the window function. Thus, since a dynamic range of the spectrum detection is increased, it is very effective in a use for precisely detecting IM5 of −60 dB or less in comparison with a carrier as in this embodiment mode.

Further, if resolution is insufficient at any cost, an FFT processing section 53 for differently setting a twiddle factor or an FFT processing section 53 for multiplying and inputting a twiddle factor such as 1, 2, 3 Hz in advance may be arranged in parallel. There is a probability that processing can be performed by a small arithmetic amount in comparison with an order (n×log(n)) of a general arithmetic amount of FFT.

The distortion extracting section 53 will next be explained. Spectrum intensity information corresponding to a point number is inputted to the distortion extracting section 53. These are partitioned into areas of −IM5, −IM3, a carrier, +IM3, +IM5. The respective areas are different between when all four carriers are used and when all four carriers are not used. Accordingly, in accordance with necessity, a use situation of the carrier is set to be acquired from an upper order device. The partitioned spectrum intensity information is changed to electric power by square, and is added within each area, and becomes total electric power of each area. Thereafter, the total electric power of each distortion component is divided by the total electric power of the carrier, and a relative level relative to a carrier is outputted. Each total electric power or the relative level to the carrier may be also further averaged by plural FFT time numbers.

Otherwise, the distortion extracting section 53 may independently grasp the use situation of the carrier by the following method and may also calculate each IM. Namely, it is supposed that the carrier is arranged at a constant frequency interval $\Delta f$, and plural frequencies $f_{CN}$ (N=1 - - - n) able to be used as the carrier and a band width $f_{BW}$ of the carrier are stored in advance.

As step 1, the spectrum intensity information is scanned, and maximum intensity is retrieved. As step 2, a value provided by multiplying the maximum intensity by a number of 1 or less determined in advance is set to a threshold value. As step 3, the spectrum intensity information is scanned, and a carrier including the frequency of the spectrum exceeding the threshold value is specified. It is judged whether this frequency is included or not by judging whether $f_{CN}$ satisfying $f < f_{CN} + f_{BW}/2$ and $f > f_{CN} - f_{BW}/2$ exists or not with respect to the frequency f of the spectrum. Thus, the use situation of each carrier is known.

As step 4, the band of each IM of an object is determined from the use carrier. For example, if a use carrier number is 2 or more, and no frequency provided by adding or subtracting $\Delta f$ with respect to the frequency of each use carrier is used in a separate carrier, this frequency is a central frequency of one IM3. The band width of IM is set to e.g., $\Delta f$. IM3 of high (highest) frequency among plural IM3 is set to +IM3, and IM3 of low frequency is set to −IM3. Similarly, frequency provided by adding or subtracting $2\Delta f$ can become IM5. When the use carrier number is 1, a frequency range stored in advance is set to each IM with a central frequency of the carrier as a reference.

In this embodiment mode, time window processing and averaging processing are performed by hardware, and time/frequency conversion processing is performed by software. However, all the processings may be also performed by software, and may be also performed by hardware. Further, the present invention may be also applied to various kinds of conversions (wavelet conversion, etc.) for performing similar convolution as well as FFT.

Further, the distortion compensation amplifying device in accordance with the present invention can be easily applied to a wireless communication device, and performance of the wireless communication device can be further raised. Here, for example, a base station, a terminal, a relay station, wireless LAN (Local Area Network), etc. in the wireless communication system of a portable telephone, etc. can be included in the wireless communication device.

A time window processing section corresponds to the time window generating section 32 and the multiplying section 33 in the embodiment mode. Further, an averaging processing section corresponds to the adding section 34, the counter 41, the switching section 42 and the dual port memory 51 in the embodiment mode. Further, a time/frequency conversion processing section corresponds to the FFT processing section 52 in the embodiment mode.

The invention claimed is:

1. A distortion detector for detecting distortion in a frequency domain with respect to a time domain signal in a time domain, the distortion detector comprising:

a time window processing section for multiplying the time domain signal by a time window so as to output a result of the multiplication;

an averaging processing section for averaging the result of the multiplication so as to output a result of the averaging;

a time/frequency conversion processing section for converting the result of the averaging into a frequency domain signal according to a predetermined time length; and a distortion extracting section for extracting a distortion component from the frequency domain signal, wherein:
the predetermined time length is derived from a unit for performing the time/frequency conversion,
the time window has a period having n times the predetermined time length, where n is an integer equal to or larger than 2, and
the average processing section makes an average by making an adding calculation n-times at an interval of said predetermined time length within said time window.

2. The distortion detector according to claim 1, wherein the averaging processing section includes a memory, stores a first signal of n number of signals of said predetermined time length within said time window in the memory, and sequentially adds second to n-th signals to the first signal stored in the memory so as to output a signal stored in the memory after the sequential adding as a result of the averaging.

3. A distortion compensation amplifying device for amplifying an external signal inputted from the exterior and compensating distortion, the distortion compensation amplifying device comprising:

an amplifying section for amplifying a first signal and outputting the amplified first signal;

a distributing section for distributing the amplified first signal and outputting outputs based on the distribution;

a time window processing section for multiplying one of the outputs from the distributing section by a time window so as to output a result of the multiplication;

an averaging processing section for averaging the result of the multiplication so as to output a result of the averaging;

a time/frequency conversion processing section for converting the result of the averaging into a frequency domain signal according to a predetermined time length;

a distortion extracting section for extracting a distortion component from the frequency domain signal; and a distortion compensating section for giving pro-distortion to the external signal inputted from the exterior based on a reverse characteristic and selling the given external signal to the first signal, the reverse characteristic being updated by an adaptive algorithm using the extracted distortion component, wherein:
the predetermined time length is derived from a unit for performing the time/frequency conversion,
the time window has a period having n times the predetermined time length, where n is an integer equal to or larger than 2, and
the averaging processing section makes an average by making an adding calculation n-times at an interval of said predetermined time length within said time window.

* * * * *

UNITED STATES PATENT AND TRADEMARK OFFICE
CERTIFICATE OF CORRECTION

| | | |
|---|---|---|
| PATENT NO. | : 7,696,761 B2 | Page 1 of 1 |
| APPLICATION NO. | : 11/795989 | |
| DATED | : April 13, 2010 | |
| INVENTOR(S) | : Tetsuhiko Miyatani et al. | |

It is certified that error appears in the above-identified patent and that said Letters Patent is hereby corrected as shown below:

Title Page; should read

(22) PCT Filed: November 18, 2005

Signed and Sealed this

Twenty-first Day of September, 2010

David J. Kappos
*Director of the United States Patent and Trademark Office*